United States Patent
Ko

(10) Patent No.: US 8,536,904 B2
(45) Date of Patent: Sep. 17, 2013

(54) COMMAND BUFFER CIRCUIT OF SEMICONDUCTOR APPARATUS

(75) Inventor: Jae Bum Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 243 days.

(21) Appl. No.: 13/217,433

(22) Filed: Aug. 25, 2011

(65) Prior Publication Data
US 2012/0126857 A1    May 24, 2012

(30) Foreign Application Priority Data
Nov. 23, 2010    (KR) .................... 10-2010-0116892

(51) Int. Cl.
*H03B 1/00* (2006.01)
(52) U.S. Cl.
USPC ........................................................ 327/108
(58) Field of Classification Search
None
See application file for complete search history.

(56) References Cited

U.S. PATENT DOCUMENTS

| 7,449,914 B2* | 11/2008 | Kim et al. ..................... 326/30 |
| 7,498,834 B2* | 3/2009 | Kim ................................ 326/30 |
| 2011/0176371 A1* | 7/2011 | Jang et al. ................. 365/189.05 |

FOREIGN PATENT DOCUMENTS

| KR | 1020080083796 A | 9/2008 |
| KR | 1020100066849 A | 6/2010 |

* cited by examiner

*Primary Examiner* — Lincoln Donovan
*Assistant Examiner* — Khareem E Almo
(74) *Attorney, Agent, or Firm* — William Park & Associates Patent Ltd.

(57) ABSTRACT

A command buffer circuit of a semiconductor apparatus includes a first buffer configured to receive a first command signal and generate a first command control signal, a second buffer configured to receive a second command signal and generate a second command control signal, a second block configured to select and output the first command control signal or the second command control signal in response to a rank control signal, and a control signal generation block configured to generate the rank control signal in response to a single rank signal and a chip select signal.

19 Claims, 7 Drawing Sheets

COMMAND BUFFER CIRCUIT OF SEMICONDUCTOR APPARATUS

CROSS-REFERENCES TO RELATED APPLICATION

The present application claims priority under 35 U.S.C. §119(a) to Korean application number 10-2010-0116892, filed on Nov. 23, 2010, in the Korean Intellectual Property Office, which is incorporated herein by reference in its entirety.

BACKGROUND

1. Technical Field

The present invention relates generally to a semiconductor apparatus, and more particularly, to a command buffer circuit of a semiconductor apparatus.

2. Related Art

There are various known ways to control the memory areas of the plurality of memory chips in a semiconductor apparatus.

A rank structure is one way to separate the memory areas. A single rank structure recognizes the memory areas as one to control the memory areas as one. A multi-rank structure recognizes the memory areas as two or more to separately control the multiple number of the memory areas.

A semiconductor apparatus operates in response to various external commands such as the clock enable commands and the impedance calibration commands.

The command signals for these external commands are received by a command buffer circuit in a semiconductor apparatus.

Referring to FIG. 1A, a semiconductor apparatus of a single rank structure utilizes a command buffer circuit 10 having two buffers 11, 12 for buffing the command signals such as one clock enable signal CKE and one impedance calibration signal ODT and generating the command control signals CKE_CTRL<0:N>, ODT_CTRL<0:N>.

However, now referring to FIG. 1B, a command buffer circuit 20 in a "multi-rank" semiconductor apparatus of two or four ranks controls the memory areas by distinguishing the two or four rank structure. As shown in FIG. 2B, there are four buffers 21, 22, 23, 24 in the command buffer circuit 20 for buffing the first and second clock enable signals CKE0, CKE1 and the first and second impedance calibration signals ODT0, ODT1 and generating the command control signals CKE0_CTRL<0:N>, CKE1_CTRL<0:N>, ODT0_CTRL<0:N>, ODT1_CTRL<0:N>.

A rank among the multiple ranks can be commanded to activate a clock signal with the first and second clock enable signals CKE0, CKE1 combined.

Furthermore, a rank among the multiple ranks can be commanded to perform an impedance calibration with the first and second impedance calibration signals ODT0, ODT1 combined.

Each of the buffers 11, 12, 21, 22, 23, 24 of FIGS. 1A-1B may be substantially identical to each other.

As described above, the configurations of the conventional command buffer circuits 10, 20 are different for the different rank structure, that is, the single vs. multi rank structure.

The command buffer circuit 10 configured for the single rank structure cannot be used in a multi-rank structure, and the command buffer circuit 20 configured for the multi-rank structure cannot be used in a single rank structure.

Furthermore, in spite of the multi-rank structure, it may be possible to use only one clock enable signal and one impedance calibration signal using a signal for selecting one of a plurality of memory chips.

SUMMARY

A command buffer circuit of a semiconductor apparatus capable of using both a single rank structure and a multi-rank structure is described herein.

A command buffer circuit of a semiconductor apparatus, which can be applied to a structure for using only one clock enable signal and one impedance calibration signal in spite of a multi-rank structure is described herein.

In an embodiment of the present invention, a command buffer circuit of a semiconductor apparatus includes: a first buffer configured to receive a first command signal and generate a first command control signal; a second buffer configured to receive a second command signal and generate a second command control signal; a second block configured to select and output the first command control signal or the second command control signal in response to a rank control signal; and a control signal generation block configured to generate the rank control signal in response to a single rank signal and a chip select method signal.

In an embodiment of the present invention, a command buffer circuit of a semiconductor apparatus includes: a first buffer configured to receive a first command signal to generate a first buffering signal, and generate a first command control signal using the first buffering signal; a second buffer configured to select one of a second buffering signal generated from a second command signal and the first buffering signal in response to a rank control signal, and generate a second command control signal using a selected signal; and a control signal generation block configured to generate the rank control signal in response to a single rank signal and a chip select method signal.

BRIEF DESCRIPTION OF THE DRAWINGS

Features, aspects, and embodiments are described in conjunction with the attached drawings, in which.

DETAILED DESCRIPTION

Hereinafter, a command buffer circuit of a semiconductor apparatus according to exemplary embodiments of the present invention will be described in detail with reference to the accompanying drawings.

In an embodiment of the present invention, a command buffer circuit is described as receiving a clock enable signal CKE and an impedance calibration signal ODT, among the external signals requiring distinguished rank structure.

Figure 1A:
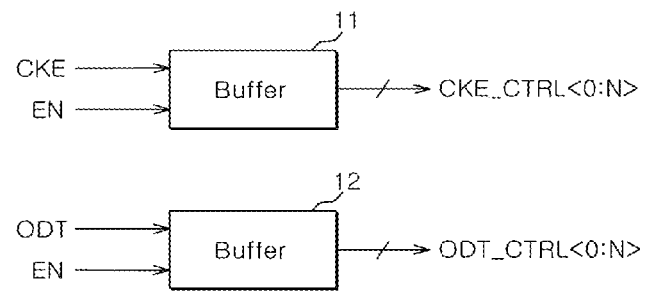
FIGS. 1A and 1B are block diagrams of command buffer circuits according to the conventional art.
Figure 1B:
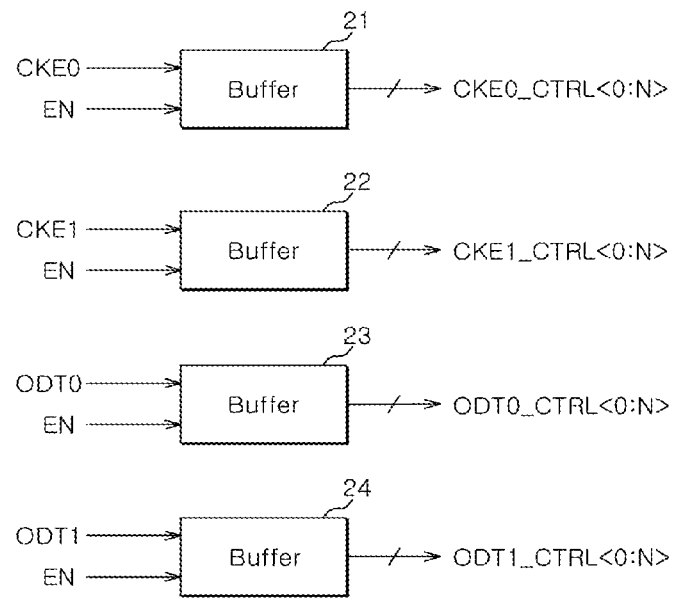
Figure 2:
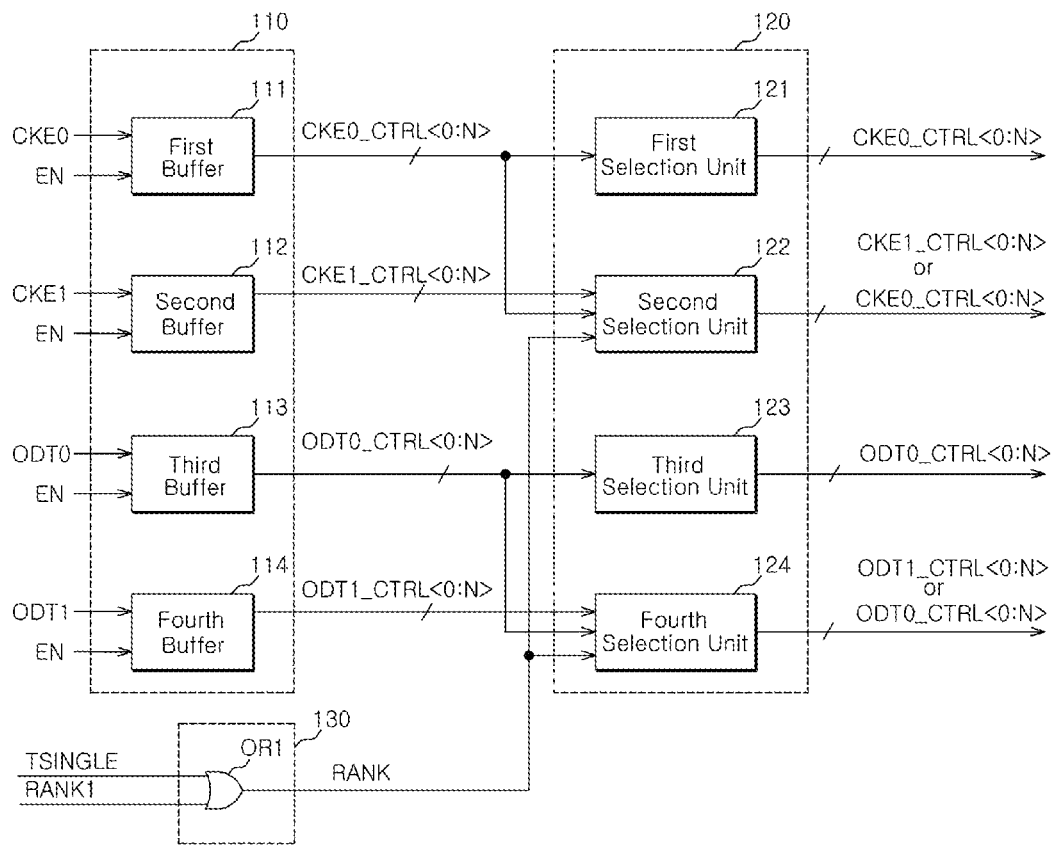
FIG. 2 is a block diagram of a command buffer circuit according to an embodiment.

Referring to FIG. 2, a command buffer circuit 100 according to an embodiment of the present invention includes a buffer block 110, a selection block 120, and a control signal generation block 130.

The buffer block 110 is configured to receive first and second clock enable signals CKE0, CKE1 and first and second impedance calibration signals ODT0, ODT1 and generate a plurality of command control signals CKE0_CTRL<0:N>, CKE1_CTRL<0:N>, ODT0_CTRL<0:N>, ODT1_CTRL<0:N>.

The first clock enable signal CKE0 and the first impedance calibration signal ODT0 are applicable to a single rank structure and a multi-rank structure, thus they CKE0, ODT0 are commonly used in the single rank structure and the multi-rank structure. The second clock enable signal CKE1 and the second impedance calibration signal ODT1 are applicable to the multi-rank structure, thus they CKE1, ODT1 are not used in a single rank structure but used only in the multi-rank structure.

The buffer block 110 includes first to fourth buffers 111, 112, 113, 114.

The first buffer 111 is configured to receive the first clock enable signal CKE0 in response to an enable signal EN and generate the command control signals CKE0_CTRL<0:N>.

The second buffer 112 is configured to receive the second clock enable signal CKE1 in response to the enable signal EN and generate the command control signals CKE1_CTRL<0:N>.

The third buffer 113 is configured to receive the first impedance calibration signal ODT0 in response to the enable signal EN and generate the command control signals ODT0_CTRL<0:N>.

The fourth buffer 114 is configured to receive the second impedance calibration signal ODT1 in response to the enable signal EN and generate the command control signals ODT1_CTRL<0:N>.

The selection block 120 is configured to output the appropriate command control signal(s) (among CKE0_CTRL<0:N>, CKE1_CTRL<0:N>, ODT0_CTRL<0:N>, ODT1_CTRL<0:N>) that is/are applicable to the rank structure of a semiconductor memory, in response to a rank control signal RANK and prevent outputting of the command control signals that are not applicable to the rank structure.

That is, when the semiconductor memory is of a single rank structure, the selection block 120 would output the command control signals CKE0_CTRL<0:N>, ODT0_CTRL<0:N> and prevent outputting of the command control signals CKE1_CTRL<0:N>, ODT1_CTRL<0:N>.

When the semiconductor memory is of a multi-rank structure, the selection block 120 would output all the command control signals CKE0_CTRL<0:N>, CKE1_CTRL<0:N>, ODT0_CTRL<0:N>, ODT1_CTRL<0:N>.

The selection block 120 includes first to fourth selection units 121, 122, 123, 124.

The first selection unit 121 is configured to receive and output the command control signals CKE0_CTRL<0:N>.

The second selection unit 122 is configured to output one of the command control signals CKE0_CTRL<0:N>, CKE1_CTRL<0:N> and prevent outputting of the other in response to the rank control signal RANK.

The third selection unit 123 is configured to receive and output the command control signals ODT0_CTRL<0:N>.

The fourth selection unit 124 is configured to output one of the command control signals ODT0_CTRL<0:N>, ODT1_CTRL<0:N> and prevent outputting of the other in response to the rank control signal RANK.

By utilizing a chip selection signal, which is a separate signal available for "multi-rank" semiconductor apparatus operations for selecting a chip among a plurality of memory chips, there exists a method (hereinafter, referred to as a chip selection method) that uses only one clock enable signal and one impedance calibration signal.

In this regard, an embodiment of the present invention as described above can be used in both the single rank structure and the multi-rank structure, and it can also be applied to a chip selection method, and the control signal generation block 130 is configured to perform them.

The control signal generation block 130 is configured to generate the rank control signal RANK in response to a single rank signal RANK1 and a chip select signal TSINGLE.

The control signal generation block 130 may include an OR gate OR1 to activate the rank control signal RANK to a logic high level when one of the single rank signal RANK1 and the chip select signal TSINGLE is activated to a logic high level.

The single rank signal RANK1 is activated to a logic high level when a semiconductor memory has a single rank structure. The chip select signal TSINGLE is activated to a logic high level when a semiconductor memory uses the chip selection method.

Figure 3A:
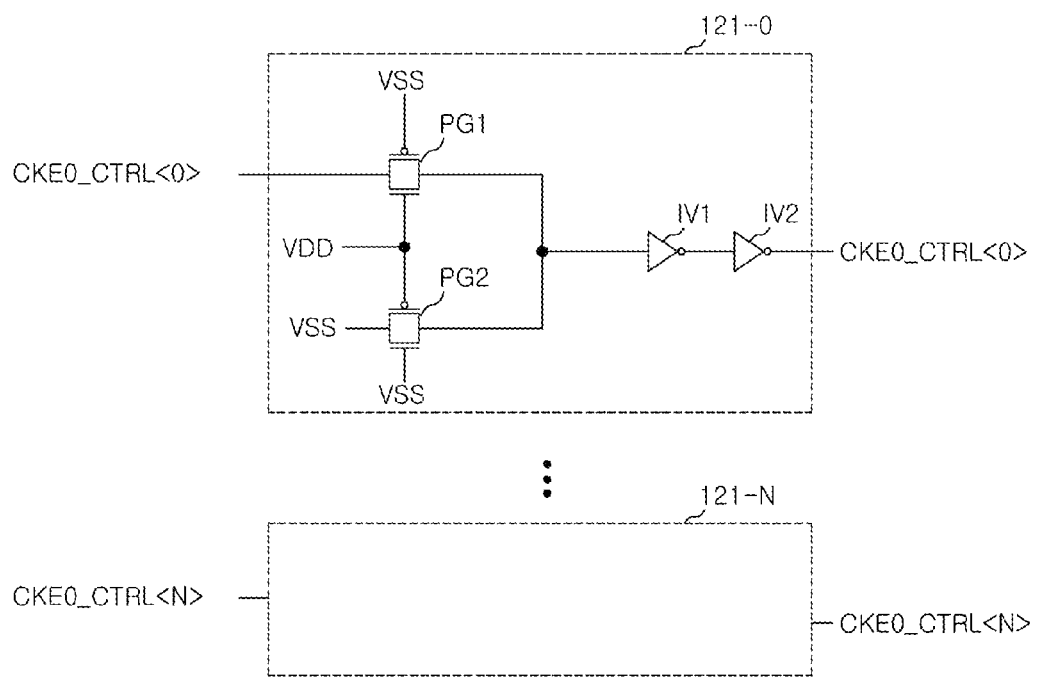
FIG. 3A is a circuit diagram of the first selection unit illustrated in FIG. 2.

Referring to FIG. 3A, the first selection unit 121 includes the selection sections 121-0 to 121-N corresponding to the number of bits of the command control signals CKE0_CTRL<0:N>.

The selection sections 121-0 to 121-N may be substantially same in configuration with respect to each other. The selection section 121-0 includes a plurality of pass gates PG1, PG2 and a plurality of inverters IV1, IV2.

The selection sections 121-0 to 121-N of the first selection unit 121 receive and output the command control signals CKE0_CTRL<0:N>, respectively, because the PMOS gates of the pass gates PG1 and the NMOS gates and the input terminals of the pass gates PG2 are grounded.

Figure 3B:
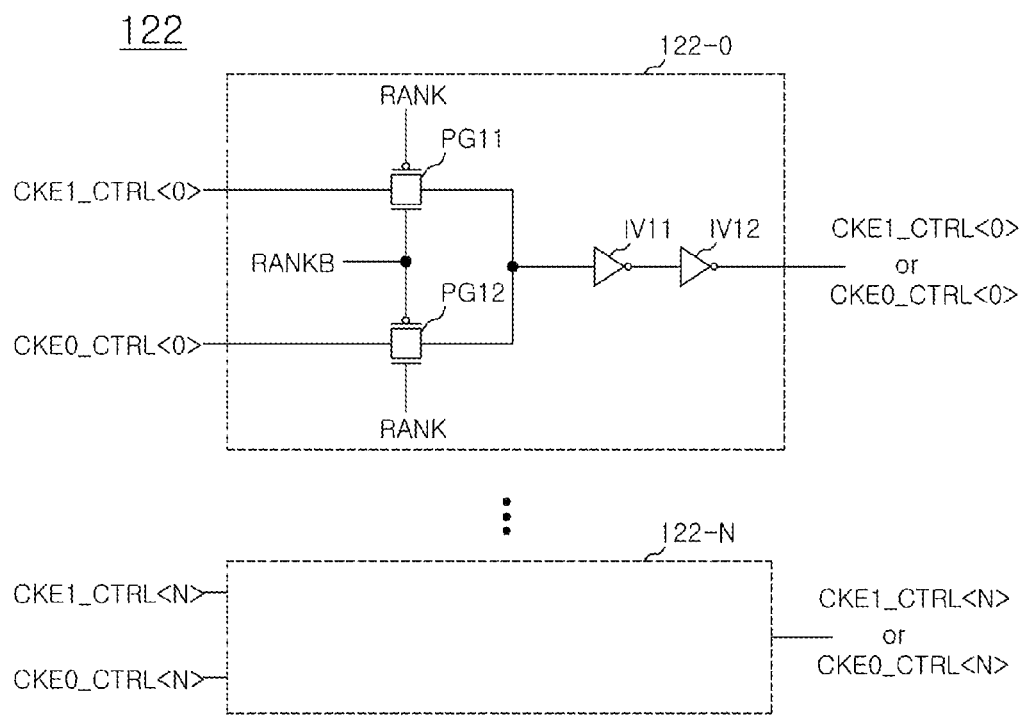
FIG. 3B is a circuit diagram of the second selection unit illustrated in FIG. 2.

Referring to FIG. 3B, the second selection unit 122 includes the selection sections 122-0 to 122-N corresponding to the number of bits of the command control signals CKE1_CTRL<0:N>.

The selection sections 122-0 to 122-N may be substantially same in configuration with respect to each other. The selection section 122-0 includes a plurality of pass gates PG11, PG12 and a plurality of inverters IV11, IV12.

The pass gate PG11 receives the rank control signal RANK through a PMOS gate thereof, receives a sub-rank control signal RANKB through an NMOS gate thereof, and receives the command control signal CKE1_CTRL<0> through an input terminal thereof.

The pass gate PG12 receives the sub-rank control signal RANKB through a PMOS gate thereof, receives the rank control signal RANK through an NMOS gate thereof, and receives the command control signal CKE0_CTRL<0> through an input terminal thereof.

When the rank control signal RANK is at a logic high level (i.e., the single rank structure), the second selection unit 122 prevents the command control signal CKE1_CTRL<0> from being inputted, because the pass gate PG11 is turned off. Rather, the second selection unit 122 outputs the command control signal CKE0_CTRL<0> via the pass gate PG12 and the inverters IV11, IV12, because the pass gate PG12 is turned on.

When the rank control signal RANK is at a logic low level (i.e., the multi-rank structure), the second selection unit 122 prevents the command control signal CKE0_CTRL<0> from being inputted, because the pass gate PG12 is turned off. Rather, the second selection unit 122 outputs the command control signal CKE1_CTRL<0> via the pass gate PG11 and the inverters IV11, IV12 because the pass gate PG11 is turned on.

The third selection unit 123 may be configured in a substantially same manner as the first selection unit 121.

The fourth selection unit 124 may be configured in a substantially same manner as the second selection unit 122.

When the rank signal RANK1 is at a high level (i.e., the single rank structure), the fourth selection unit 124 prevents the the command control signals ODT1_CTRL<0:N> from being inputted but outputs the command control signals ODT0_CTRL<0:N>.

When the rank signal RANK1 is at a low level (i.e., the multi-rank structure), the fourth selection unit 124 prevents the command control signals ODT0_CTRL<0:N> from being inputted but outputs the command control signals ODT1_CTRL<0:N>.

Figure 4:
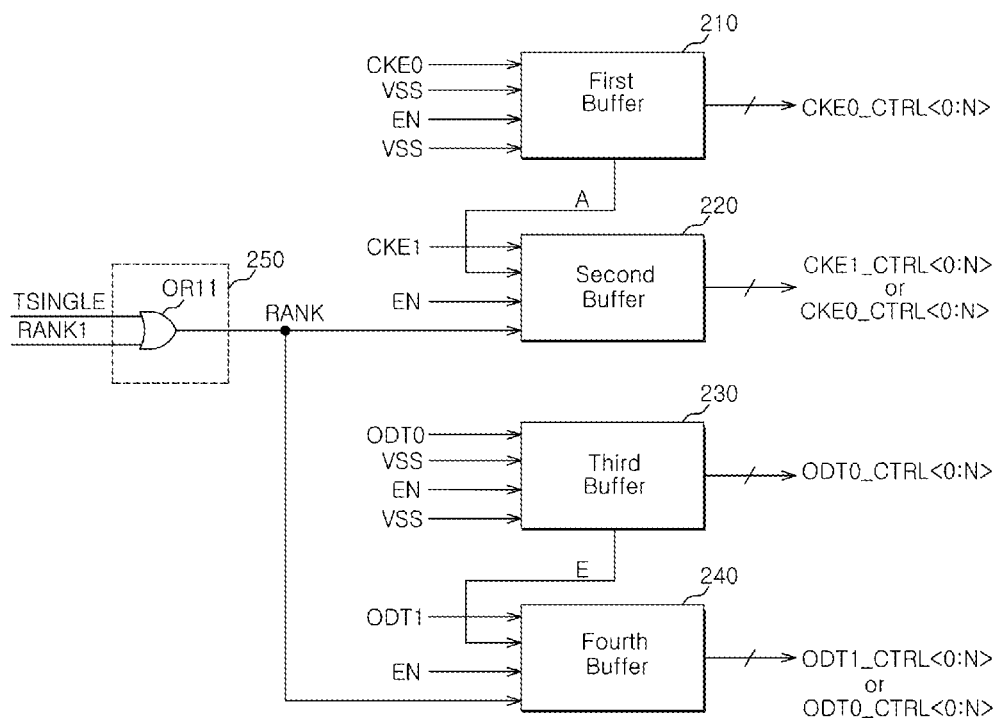
FIG. 4 is a block diagram of a command buffer circuit according to another embodiment.

Referring to FIG. 4, a command buffer circuit 200 may include first to fourth buffers 210, 220, 230, 240 and a control signal generation block 250 in accordance with an embodiment of the present invention.

The first buffer 210 is configured to receive a first clock enable signal CKE0 in response to the enable signal EN and generate the command control signals CKE0_CTRL<0:N>. Furthermore, the first buffer 210 is configured to generate a buffering signal A obtained by buffering the first clock enable signal CKE0.

The second buffer 220 is configured to receive a second clock enable signal CKE1 and the buffering signal A in response to the enable signal EN and the rank control signal RANK, and generate the command control signals CKE1_CTRL<0:N>.

The third buffer 230 is configured to receive the first impedance calibration signal ODT0 in response to the enable signal EN and generate the command control signals ODT0_CTRL<0:N>. Furthermore, the third buffer 230 is configured to generate a buffering signal E obtained by buffering the first impedance calibration signal ODT0.

The fourth buffer 240 is configured to receive the second impedance calibration signal ODT1 and the buffering signal E in response to the enable signal EN and the rank control signal RANK, and generate command control signals ODT1_CTRL<0:N>.

The third buffer 230 may have substantially the same configuration as that of the first buffer 210. Furthermore, the fourth buffer 240 may have substantially the same configuration as that of the second buffer 220.

The control signal generation block 250 may have substantially the same configuration as that of the control signal generation block 130 illustrated in FIG. 2. The control signal generation block 250 includes an OR gate OR11.

Figure 5:
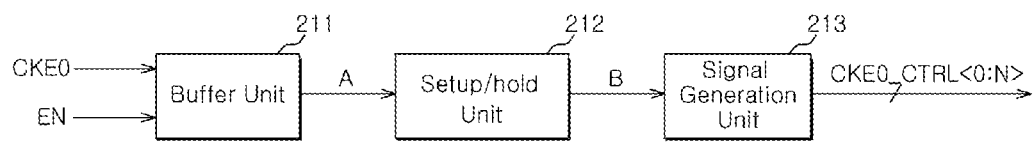
FIG. 5 is a block diagram illustrating the internal configuration of the first buffer illustrated in FIG. 4.

Referring to FIG. 5, the first buffer 210 may include a buffer unit 211, a setup/hold unit 212, and a signal generation unit 213.

The buffer unit 211 is configured to buffer the first clock is enable signal CKE0 in response to the activation of the enable signal EN and generate the buffering signal A.

The setup/hold unit 212 is configured to calibrate a setup/hold time of the buffering signal A and generate an output signal B.

The signal generation unit 213 is configured to generate the command control signals CKE0_CTRL<0:N> having different timings by using the output signal B of the setup/hold unit 212.

Figure 6:
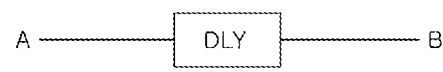
FIG. 6 is a circuit diagram of the setup/hold unit illustrated in FIG. 5.

Referring to FIG. 6, the setup/hold unit 212 may include a delay element DLY.

Figure 7:
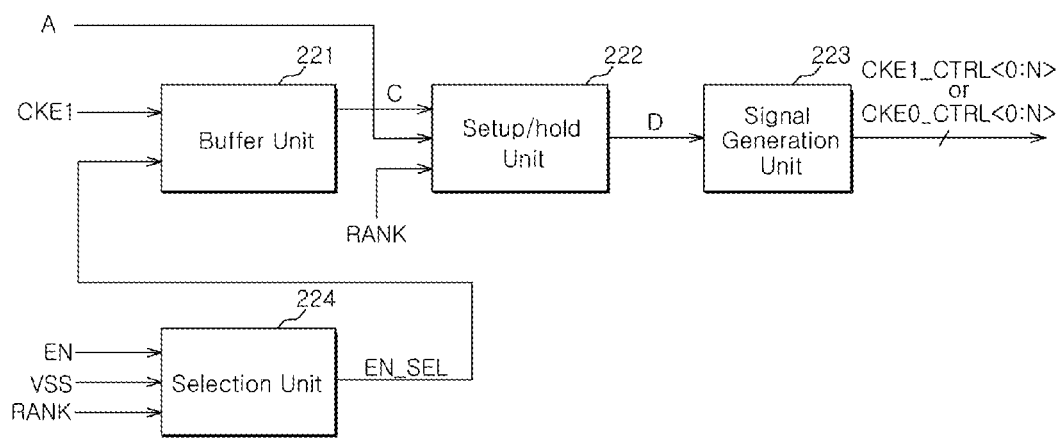
FIG. 7 is a block diagram illustrating the internal configuration of the second buffer illustrated in FIG. 4.

Referring to FIG. 7, the second buffer 220 may include a buffer unit 221, a setup/hold unit 222, a signal generation unit 223, and a selection unit 224.

The selection unit 224 is configured to output the enable signal EN as a selection control signal EN_SEL when the rank control signal RANK is at a logic low level defining a multi-rank structure. The selection unit 224 is configured to output a signal corresponds to a deactivation level of the enable signal EN (for example, a ground level) as the selection control signal EN_SEL when the rank control signal RANK is at a logic high level, which signifies that the chip select method is being used although the rank control signal RANK may indicate the single or multi rank structure.

The selection unit 224 may have substantially the same configuration as that of the second selection unit 122 illustrated in FIG. 3B.

The buffer unit 221 is configured to receive the second clock enable signal CKE1 in response to the selection control signal EN_SEL and generate a buffering signal C.

The setup/hold unit 222 is configured to select one of the buffering signals A and C in response to the rank control signal RANK, and calibrate a setup/hold time of the selected signal to generate an output signal D.

The signal generation unit 223 is configured to generate the command control signal CKE1_CTRL<0:N> or CKE0_CTRL<0:N> having different timings by using the output signal D received from the setup/hold unit 222.

Figure 8:
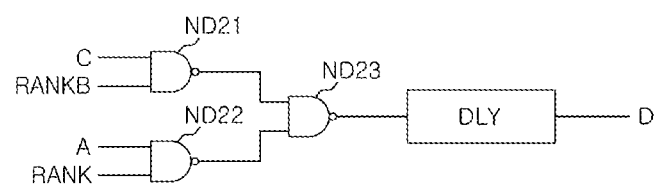
FIG. 8 is a circuit diagram of the setup/hold unit illustrated in FIG. 7.

Referring to FIG. 8, the setup/hold unit 222 includes a plurality of NAND gates ND21, ND22, ND23 and a delay element DLY.

When the rank control signal RANK is at a logic high level, the setup/hold unit 222 calibrates a setup/hold time of the output signal D by allowing the buffering signal A to pass through the delay element DLY.

When the rank control signal RANK is a logic low level, the setup/hold unit 222 calibrates the setup/hold time of the output signal D by allowing the buffering signal C to pass through the delay element DLY.

According to an embodiment as shown in FIG. 2, (as it is also apparent from FIG. 3B), since one of the two command control signals CKE0_CTRL<0:N>, CKE1_CTRL<0:N> is selected according to the rank control signal RANK, each of the first to fourth selection units 121, 122, 123, 124 includes N+1 selection sections.

According to an embodiment as shown in FIG. 4, (as it is also apparent from FIG. 7), since a signal selected according to the rank control signal RANK has one bit (A or C), each of the first to fourth buffers 210, 220, 230, 240 includes one selection unit 224, so that a circuit area can be relatively reduced.

Since the command buffer circuit of the semiconductor apparatus according to various embodiments of the present invention can be used regardless of a rank structure, it is not necessary to separately design a circuit according to the rank structure. Furthermore, since the command buffer circuit can be applied to the case in which only one clock enable signal and one impedance calibration signal are used in a multi-rank structure, a product application range is wide.

While certain embodiments have been described above, it will be understood to those skilled in the art that the embodiments described are by way of example only. Accordingly, the command buffer circuit of the semiconductor apparatus described herein should not be limited based on the described embodiments. Rather, the command buffer circuit of the semiconductor apparatus described herein should only be limited in light of the claims that follow when taken in conjunction with the above description and accompanying drawings.

What is claimed is:

1. A command buffer circuit of a semiconductor apparatus, comprising:
 a first buffer configured to receive a first command signal and generate a first command control signal;
 a second buffer configured to receive a second command signal and generate a second command control signal;
 a second block configured to select and output the first command control signal or the second command control signal in response to a rank control signal; and
 a control signal generation block configured to generate the rank control signal in response to a single rank signal and a chip select signal.

2. The command buffer circuit according to claim 1, wherein the first command signal and the second command signal include a clock enable signal or an impedance calibration signal for separating a plurality of ranks.

3. The command buffer circuit according to claim 1, wherein the single rank signal is activated when a semiconductor apparatus has a single rank structure.

4. The command buffer circuit according to claim 1, wherein the chip select signal is activated when a semiconductor apparatus has a multi-rank structure and uses only one clock enable signal.

5. The command buffer circuit according to claim 1, wherein the control signal generation block is configured to activate the rank control signal when one of the single rank signal and the chip select signal is activated.

6. A command buffer circuit of a semiconductor apparatus, comprising:
 a first buffer configured to receive a first command signal to generate a first buffering signal, and generate a first command control signal using the first buffering signal;
 a second buffer configured to select one of a second buffering signal generated from a second command signal and the first buffering signal in response to a rank control signal, and generate a second command control signal using a selected signal; and
 a control signal generation block configured to generate the rank control signal in response to a single rank signal and a chip select signal.

7. The command buffer circuit according to claim 6, wherein the first command signal and the second command signal include a clock enable signal or an impedance calibration signal for separating a plurality of ranks.

8. The command buffer circuit according to claim 6, wherein the single rank signal is activated when a semiconductor apparatus has a single rank structure.

9. The command buffer circuit according to claim 6, wherein the chip select signal is activated when a semiconductor apparatus has a multi-rank structure and uses only one clock enable signal.

10. The command buffer circuit according to claim 6, wherein the first buffer comprises:
 a buffer unit configured to receive the first command signal in response to an enable signal and generate the first buffering signal; and
 a setup/hold unit configured to calibrate a setup/hold time of the first buffering signal.

11. The command buffer circuit according to claim 6, wherein the second buffer comprises:
 a buffer unit configured to receive the second command signal in response to a selection control signal and generate the second buffering signal;
 a selection unit configured to output an enable signal as a selection control signal in response to the rank control signal; and
 a setup/hold unit configured to select one of the first buffering signal and the second buffering signal in response to the rank control signal, and calibrate a setup/hold time of a selected signal.

12. The command buffer circuit of a semiconductor apparatus, comprising:
 a buffer block configured to receive a plurality of command signals and output a plurality of command control signals;
 a control signal generation block configured to receive a chip select signal and a single rank signal and output a rank control signal;
 a selection block configured to receive the plurality of command control signals and the rank control signal and output either subset or all of the command control signals in response to the rank control signal.

13. The command buffer circuit of claim 12, wherein the command signals comprises a clock enable signal and a impedance calibration signal.

14. The command buffer circuit of claim 12, wherein the buffer block comprises:
 a first buffer configured to receive a first command signal and generate a first command control signal;
 a second buffer configured to receive a second command signal and generate a second command control signal.

15. The command buffer circuit of claim 14, wherein the selection block comprises:
 a second block configured to select and output the first command control signal or the second command control signal in response to a rank control signal.

16. The command buffer circuit according to claim 15,
 wherein the single rank signal is activated to a predetermined logic level when a semiconductor apparatus has a single rank structure, and
 wherein the chip select signal is activated to a predetermined logic level when the semiconductor apparatus has a multi-rank structure and uses only one clock enable signal.

17. The command buffer circuit according to claim 16, wherein the control signal generation block is configured to activate the rank control signal to a predetermined logic level when one of the single rank signal and the chip select signal is activated.

18. The command buffer circuit according to claim 17, wherein when the rank control signal is activated to the predetermined level, a first selection unit outputs the command control signal.

19. The command buffer circuit according to claim 17, wherein when the rank signal is not activated to the predetermined level both the first and second selection units outputs the command control signals.

* * * * *